United States Patent [19]

Witucki et al.

[11] Patent Number: 4,692,225
[45] Date of Patent: Sep. 8, 1987

[54] METHOD OF STABILIZING CONDUCTIVE POLYMERS

[75] Inventors: Edward F. Witucki, Van Nuys; Leslie F. Warren, Jr., Camarillo; Paul R. Newman, Newbury Park, all of Calif.

[73] Assignee: Rockwell International Corporation, El Segundo, Calif.

[21] Appl. No.: 883,253

[22] Filed: Jul. 8, 1986

[51] Int. Cl.⁴ ............................................. C25B 3/00
[52] U.S. Cl. ................................... 204/59 R; 204/12;
204/13; 204/23; 204/72; 427/58; 427/222;
427/384; 427/385.5; 427/386; 427/393.5;
428/265; 428/413; 428/473.5
[58] Field of Search .............. 427/58, 222, 384, 385.5,
427/386, 393.5; 428/473.5, 413, 265; 204/59 R,
12, 72, 13, 23

[56] References Cited

U.S. PATENT DOCUMENTS

| | | | |
|---|---|---|---|
| 3,697,398 | 10/1972 | Wessling et al. | 204/72 |
| 4,214,031 | 7/1980 | Miyakawa et al. | 428/213 |
| 4,330,573 | 5/1982 | Kostandou et al. | 427/389.8 |
| 4,394,402 | 7/1983 | Yasuta et al. | 427/222 |
| 4,468,291 | 8/1984 | Naarmann et al. | 204/72 |
| 4,547,270 | 10/1985 | Naarmann | 204/72 |
| 4,566,955 | 1/1986 | Naarmann | 204/72 |
| 4,578,433 | 5/1986 | Muenstedt et al. | 204/59 R |
| 4,582,575 | 4/1986 | Warren et al. | 204/12 |
| 4,590,103 | 5/1986 | Ahne et al. | 427/385.5 |
| 4,617,228 | 10/1986 | Newman et al. | 428/265 |

Primary Examiner—Arthur P. Demers
Attorney, Agent, or Firm—H. Fredrick Hamann; Craig O. Malin; Max Geldin

[57] ABSTRACT

A method of stabilizing electrically conductive polymers to hostile environments is disclosed. The method comprises encapsulating the conductive polymer, e.g., polypyrrole or polyaniline, as a powder, a free-standing film or preferably in the form of a composite of a substrate, such as fiberglass fabric, impregnated with the conductive polymer, with a suitable resin, preferably an epoxy resin, as an encapsulating agent. The preferred method involves pre-pregging the fabric of the conductive composite with an epoxy resin and curing the resulting system.

20 Claims, 3 Drawing Figures

STABILITY OF NEAT AND ENCAPSULATED POLYPYRROLE AT 250°/AIR/7 DAYS.

STABILITY OF NEAT AND ENCAPSULATED POLYPYRROLE AT 250°/AIR/7 DAYS.

STABILITY OF NEAT AND ENCAPSULATED POLYPYRROLE IN $O_2$/R.T./7 DAYS.

STABILITY OF NEAT AND ENCAPSULATED POLYPYRROLE AT 160°F/90% RELATIVE HUMIDITY/7 DAYS.

4,692,225

METHOD OF STABILIZING CONDUCTIVE POLYMERS

BACKGROUND OF THE INVENTION

This invention relates to stabilization of conductive polymers and is especially directed to a method of stabilizing electrically conductive polymers, particularly polypyrrole or polyaniline, to hostile environments.

Conductive polymers, such as polypyrrole or polyaniline, can be prepared using either electrochemical or purely chemical means. Thus, polypyrrole is produced by electropolymerization as described by A. F. Diaz, et al in an article entitled "Electrochemical Polymerization of Pyrrole" in the *Journal of Chemical Society, Chemical Communications*, 1979, page 635. This process produces thin (from about 20 nm to 20 μm) free-standing films. N-substituded analogs of pyrrole such as poly-N-methylpyrrole and poly-N-phenylpyrrole have been used to form polypyrrole as reported by A. F. Diaz, et al in an article entitled "Electrochemistry of Conducting Polypyrrole Films" in the *Journal of Electroanalytical Chemistry*, 129, (1981) pages 115–132. However, the resulting conductive polypyrrole does not have the bulk and ductility required to make the material useful in structural-related applications.

U.S. Pat. No. 4,552,927 to L. F. Warren discloses a conductive polypyrrole which can be produced in thicker layers and has increased mechanical flexibility as compared to prior art polypyrrole film, obtained by electropolymerizing pyrrole from an electrolyte containing a non-nucleophilic polymeric anion, such as polystyrene-sulfonate, and pyrrole.

U.S. Pat. No. 4,582,575 to L. F. Warren, D. S. Klivans and L. Maus discloses an electrically conductive composite comprising a dielectric porous substance, such as fiberglass fabric, and an electrically conductive pyrrole polymer deposited in the pores of such substance, by contacting such porous substance with an anode in an electrolytic cell containing an electrolyte comprising a pyrrole monomer and a substantially non-nucleophilic anion, such as sulfate, and electrochemically depositing a conductive pyrrole polymer in the pores of such substance.

U.S. Application Ser. No. 646,717, filed Sept. 4, 1984, of P. R. Newman, L. F. Warren, Jr. and E.F. Witucki, and assigned to the same assignee as the present application, now U.S. Pat. No. 4,617,228 discloses a chemical process for producing an electrically conductive composite which comprises contacting a dielectric porous substance, such as fiberglass fabric with a liquid pyrrole, contacting the porous substance with a solution of a strong oxidant capable of oxidizing pyrrole to a pyrrole polymer, such as ferric cation, and oxidizing the pyrrole in the presence of a substantially non-nucleophilic anion, such as sulfate, and precipitating a conductive pyrrole polymer in the pores of such substance.

A requirement for the conductive polymeric material prepared by any of the above methods is that the electrical properties remain stable in potentially hostile environments. Such environments include, for example, 250° F. in air, 100% $O_2$ at room temperature, and 90% relative humidity at 160° F. In addition, these conductive materials should exhibit a long-term shelf life stability. It has been shown that in the neat or pure and unprotected state, these conductive polymeric compounds are not very stable in the above environments, and lose their electrical conductivity.

SUMMARY OF THE INVENTION

It is an object of the invention to provide a method of stabilizing the conductivity of conductive polymers.

Another object of the invention is the provision of procedure for stabilizing conductive polymers, particularly polypyrrole and polyaniline, in hostile environments, and improving the shelf-life of such conductive polymers.

A still further object is to provide a process for stabilizing the conductivity of composites of a substrate, such as fiberglass fabric, impregnated with a conductive polymer, such as polypyrrole.

A still further object is the provision of improved stabilized electrically conductive polymers, particularly polypyrrole and polyaniline, produced by the invention process.

According to the invention, electrically conductive polymers and composites containing conductive polymers can be rendered stable against loss of conductivity by encapsulation using a suitable resin, such as an epoxy, as the encapsulating agent. Conductive polymer material, particularly polypyrrole or polyaniline, in powder form, or as a free film or as a composite of a porous substrate impregnated with such conductive polymers, can be readily coated or impregnated with the encapsulating resin.

The encapsulation procedure comprises pre-pregging the conductive polymeric material or the porous substrate, e.g., fabric of the conductive composite, with the resin, particularly epoxy resin, and then curing the resulting system using conventional resin-curing techniques. The resulting encapsulated material or laminate has been shown to be stable electrically in all three of the above-noted environments. In addition, the encapsulated material has been found to have excellent long-term (shelf-life) stability.

BRIEF DESCRIPTION OF THE DRAWINGS

The invention will be more clearly understood by reference to the preferred embodiments set forth hereinafter, taken in conjunction with the accompanying drawings wherein.

DESCRIPTION OF THE PREFERRED EMBODIMENTS

Figure 1:
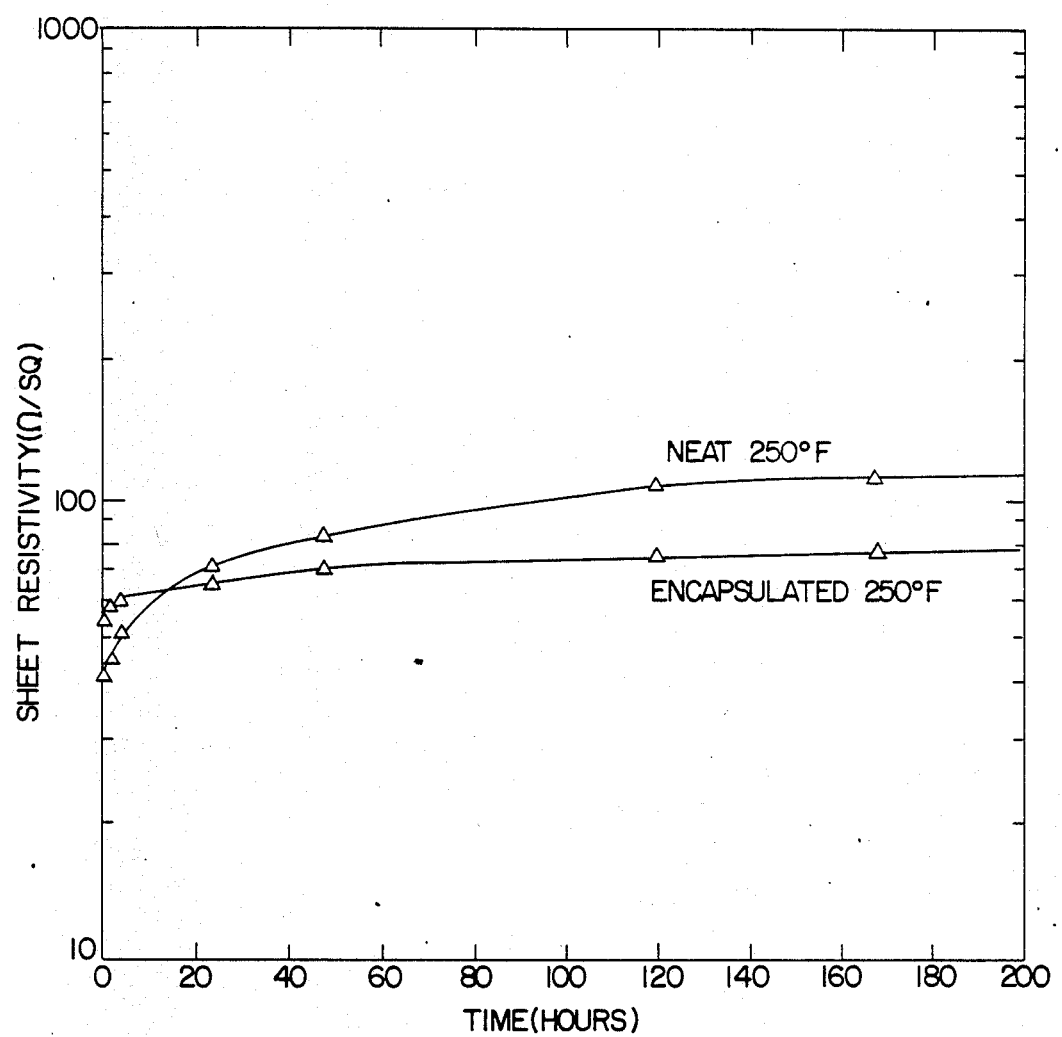
FIGS. 1, 2 and 3 are plots illustrating the relative stability of neat and encapsulated polypyrrole composites to various hostile environments.

Electrodeposition of polypyrrole by electropolymerization of pyrrole from a suitable electrolyte produces a polymeric deposit which has a linked pyrrole chain cationic portion balanced by an affiliated electrolyte dopant anion. Where large non-nucleophilic polymeric anions, such as polystyrene sulfonate derived from polystyrenesulfonic acid is employed in the electrolyte, free-standing conductive polypyrrole films can be obtained which have good ductility and mechanical properties. Such polypyrrole films and their method of production is described in above-noted U.S. Pat. No. 4,552,927, which is incorporated herein by reference.

Conductive polypyrrole in powder form can be produced by a process which utilizes a strong oxidant to react with pyrrole and with C-substituted and N-substituted derivatives in a solvent to form a precipitate of the doped polypyrrole. Suitable oxidizing agents include salts, e.g., of $Fe^{3+}$ or $Cu^{2+}$, the reduced species of which remain soluble and separable from the precipitated polymer. The oxidant counterion (anion) is incorporated in the polymer as the dopant. Aqueous or non-aqueous (acetonitrile or dichloromethane) solvents can be utilized. The process for producing such conductive polypyrrole powder is described in U.S. application Ser. No. 882,202, filed 7/8/86, of L. F. Warren, Jr., and E. F. Witucki, and assigned to the same assignee as the present application, and is incorporated herein by reference.

Of particular interest are electrically conductive composites prepared by impregnating a porous substrate, such as a fabric, e.g., fiberglass fabric, with a conductive polymer material, such as polypyrrole. This can be accomplished, according to one method of procedure, by contacting a porous substance with an anode in an electrolytic cell containing an electrolyte comprising a pyrrole monomer and a substantially non-nucleophilic anion, electrochemically depositing a conductive pyrrole polymer in the pores of the substance and removing the resulting composite comprised of the porous substance impregnated with the pyrrole polymer from the anode.

In such process, a porous dielectric or electric insulating material can be used as substrate, such as a porous ceramic, a porous glass, e.g., a frit, a porous organic foam, e.g., polyurethane, a fabric, which can be woven or non-woven, e.g., fiberglass fabric, a mixed oxide fabric, such as an alumina-silica-boria fabric, e.g., Nextel, or a synthetic organic fabric, such as Kevlar, a trademark of the DuPont Company for aromatic polyamide fiber, a polyester such as Dacron cloth, and the like.

The pyrrole monomer employed can be pyrrole or a C-substituted pyrrole, such as a 3- or 3,4-alkyl or aryl-substituted pyrrole, e.g., 3-methylpyrrole, or an N-substituted pyrrole such as an N-alkyl pyrrole or an N-arylpyrrole, e.g., N-methylpyrrole.

A compound or material providing substantially non-nucleophilic anions is also included in the electrolyte. These are generally strong acid anions, such as sulfate, bisulfate, perchlorate and fluoborate anions. Examples of compounds providing such anions include sulfuric acid, sodium sulfate, sodium bisulfate, ammonium fluoborate, and perchloric acid.

The electrolyte is preferably an aqueous system, but an organic solvent which will dissolve both the pyrrole and the soluble non-nucleophilic anion-containing salt or acid as the supporting electrolyte and is non-reactive therewith, can be employed. Such solvents include alcohols, acetone, acetonitrile and the like. The electrolyte can also include a wetting agent, e.g., sodium dodecylsulfate.

During electrolysis, the conductive polypyrrole, comprised of a positively charged polypyrrole framework or cation and non-nucleophilic anion, precipitates on the anode and within the pores of the porous substrate, e.g., fiberglass fabric. After precipitation of the conducting polymers within the pores of the substrate, the anode containing the polymer-impregnated substrate is removed, and the conductive composite is then peeled from the anode. The composite has good mechanical properties and is essentially non-brittle.

The above electrochemical process for producing a conductive polypyrrole composite is described in the above U.S. Pat. No. 4,582,575 and is incorporated herein by reference.

The conductive polypyrrole composites can also be produced by a chemical process which comprises contacting a dielectric porous substance with a liquid pyrrole, contacting the porous substance with a solution of a strong oxidant capable of oxidizing pyrrole to a pyrrole polymer and oxidizing the pyrrole in the presence of a substantially non-nucleophilic anion, and precipitating a conductive pyrrole polymer in the pores of said substance.

The porous substance or substrate can be any of those mentioned above, particularly fiberglass fabric.

The liquid pyrrole treating solution can comprise neat liquid pyrrole or a C-substituted pyrrole, as noted above. Such pyrrole solution may or may not contain a solvent, such as alcohols, dioxane and acetonitrile. Water also can be employed.

The oxidation of pyrrole or a substituted derivative thereof to produce the conductive pyrrole polymer is carried out in the presence of a strong oxidant, such as the ferric or cupric cation, e.g., as provided by ferric perchlorate or cupric fluoborate.

A material providing substantially non-nucleophilic anions functioning as dopant for the pyrrole polymer is also employed, e.g., sulfate, bisulfate, fluoborate, chloride and the like, provided by compounds, such as sulfuric acid, sodium sulfate and sodium bisulfate.

The oxidant and the non-nucleophilic anion can be provided by the same compound, e.g., as in ferric chloride. In preferred practice, the non-nucleophilic anion is present in the oxidant solution.

The time of treatment of the porous substrate in the pyrrole and oxidant solutions is long enough to penetrate the interstices of the porous material with the liquid pyrrole and to obtain sufficient penetration of the oxidant solution therein, to permit the precipitation reaction to occur in the interstices. The polypyrrole which is thus chemically precipitated remains within the interstices of the dielectric porous material after washing and drying thereof. If desired, the porous substrate can be treated first with the oxidant solution, followed by treatment of the substrate containing the oxidant solution in the interstices thereof, with a liquid pyrrole or pyrrole solution.

The above-described chemical process for impregnating conductive polypyrrole into a substrate to produce conductive composite materials is described in above-noted U.S. application Ser. No. 646,717, and is incorporated herein by reference.

Conductive polyaniline powder or films, or conductive polyaniline composites, can also be produced by processes similar to those noted above.

The encapsulation process according to the present invention comprises coating or pre-pregging the above-noted polypyrrole or polyaniline conductive materials in the form of powders, films or conductive composites, with a suitable, curable resin and then curing the resulting system. Suitable resins for this purpose include epoxy, polyimide and bis-maleimide resins, preferably epoxies. In the case of the conductive composites, there is sufficient porosity left in the composite following impregnation with polypyrrole or polyaniline to permit impregnation or permeation of the composite with the encapsulating resin. The encapsulating resin coats and sticks to the threads, e.g., of a fabric substrate, such as fiberglass fabric. In the case of the free-standing films of polypyrrole and polyaniline, the encapsulating resin also coats and adheres to the film.

The conductive polymers in the form of free films or composites can be treated with the encapsulating resin by painting or coating the conductive material with the resin, or by dipping the conductive material in the resin, or employing any other suitable method for application of the resin to such conductive material. In the case of the conductive powders, the powder is mixed with the encapsulating resin.

Following impregnation, coating or mixing with the encapsulating resin, the resulting system can be cured using standard curing techniques, such as heating to 250°–350° F. in the case of epoxy resin, for approximately one hour, with the system placed inside a vacuum bag to remove volatiles given off during the cure process.

The resulting encapsulated conductive materials have been shown to be stable electrically in various hostile environments, as illustrated in greater detail hereinafter. In addition, the encapsulated conductive materials have been shown to have excellent shelf-life.

The thickness of the encapsulating, e.g., epoxy, resin covering the conductive material can range from about 1 mil up to about 2 inches. In use of the encapsulated conductive materials produced according to the invention, the encapsulating resin, which is generally in the nature of a hard coating, is not removed. The encapsulated conductive materials produced according to the invention have application as conductive composite structural materials, semi-conductor components, in anti-static applications, in electromagnetic interference shielding applications, and as electrical conductors.

The following are examples of practice of the invention.

EXAMPLE I (a) Chemical Preparation of Conductive Polypyrrole Powder

To 16.2 grams (0.1 mole) of ferric chloride in 150 mls of acetonitrile was added dropwise 2.7 grams (0.04 mole) of pyrrole in 20 mls of acetonitrile. The addition was complete in 10 minutes; a black precipitate formed immediately. The reaction mixture was stirred at ambient temperature for 1 hour. It was then filtered and the black insoluble conductive polypyrrole (1.1 grams) was washed well with acetonitrile. The dry solid powder had a conductivity of 30 $ohm^{-1} cm^{-1}$.

(b) Chemical Preparation of Conductive Polyaniline Powder

To 17 grams (0.18 mole) of aniline in 300 mls of water and 10 mls of sulfuric acid was added 63 grams (0.27 mole) of ammonium persulfate. Some cooling was required at this point; much black precipitation was in evidence. After stirring the reaction mixture several hours at ambient temperature, the black solid polyaniline was filtered and washed well with water and acetone. Total weight was 24 grams; its conductivity was 50 $ohm^{-1} cm^{-1}$.

(c) Encapsulation of Chemically Formed Polypyrrole and Polyaniline Powder

Each of the above polypyrrole and polyaniline powders was stirred into an epoxy resin/curing agent mixture consisting of Shell Epon 9102 and Shell CA 9150 curing agent (an acid-anhydride system), in a 3-6/10 weight ratio of the conductive powder to the above epoxy resin/curing agent mixture, spread flat onto a Teflon-coated fabric to which it would not stick when pre-cured.

The above system was pre-cured at 180° F. for 15 minutes, and then subjected to a cure cycle in a high pressure press at 350° F. and 100 psi for 1 hour.

EXAMPLE II

Encapsulation of a Free-standing Electrochemically Generated Polypyrrole Film

A free-standing polypyrrole film was anodically deposited from an aqueous electrolyte onto a polished flat gold-plated copper cathode with an exposed area of 28 $cm^2$. The cathode compartment was separated from the anode solution by means of an agar/glass frit separator, and a Pt basket cathode was supported directly over the anode, which lay flat at the bottom of the cell. The supporting electrolyte and pyrrole concentrations were 0.1 M each; p-toluenesulfonic acid was the supporting electrolyte. A total solution volume of one liter was placed in the anode compartment.

The polypyrrole film was deposited from quiescient solution at 3.6 $ma/cm^2$ until 1000 coulombs had passed. The resulting film was removed from the anode by carefully peeling, was rinsed with water, and allowed to dry.

The polypyrrole film was painted on both sides with the Shell Epon 9102/CA 9150 epoxy/curing agent mixture of Example I (in a 74:26 ratio). The sample was precured at 180° F. for 15 minutes and cured in a high pressure press as in the preceding example.

EXAMPLE III (a) Impregnation of Polypyrrole into an Insulating Substrate

Two solutions are necessary for the treatment. The first solution was made up of 20 gms of ferric chloride in 200 mls of acetone; the second solution consisted of 4 ml of pyrrole in 200 mls of pentane.

An insulating substrate, fiberglass, is dipped first into the ferric chloride solution, dried, and then dipped into the pyrrole solution and again dried. The time interval for each dipping is 5–10 minutes. Dipping in both solutions can be considered 1 cycle. Conductivity can be varied with the number of cycles. One cycle yields conductivities corresponding to a sheet resistivity of about 500 ohms/square; 4 cycles yields conductivities corresponding to a sheet resistivity of about 100 ohms/square. The term "ohms/square" is defined as the bulk resistivity of the sample in ohms × cm divided by the thickness in cm. Sheet resistivity is proportional to the reciprocol of electrical conductivity.

(b) Lamination of Impregnated Substrates

This example is for a 6"×6" four-ply laminate. The four impregnated plies of fabrics, each produced as in (a) above, following one cycle of polypyrrole inpregnation, were painted separately at ambient temperature with 40 grams of epoxy resin mixture. The resin mixture consisted of 74% of Shell's Epon 9102 epoxy resin and 26% (Shell CA 9150) curing agent. The four plies were precured at 180° F. for 15 minutes, stacked together and cured in a high-pressure press. The pressure was approximately 150 psi. The temperature was raised to 320° F., held there for 15 minutes, then to 350° F. and held there for 1 hour. The heating rate was 5° F./min. The resulting laminate exhibited good electrical and mechanical properties.

EXAMPLE IV

Figure 2:
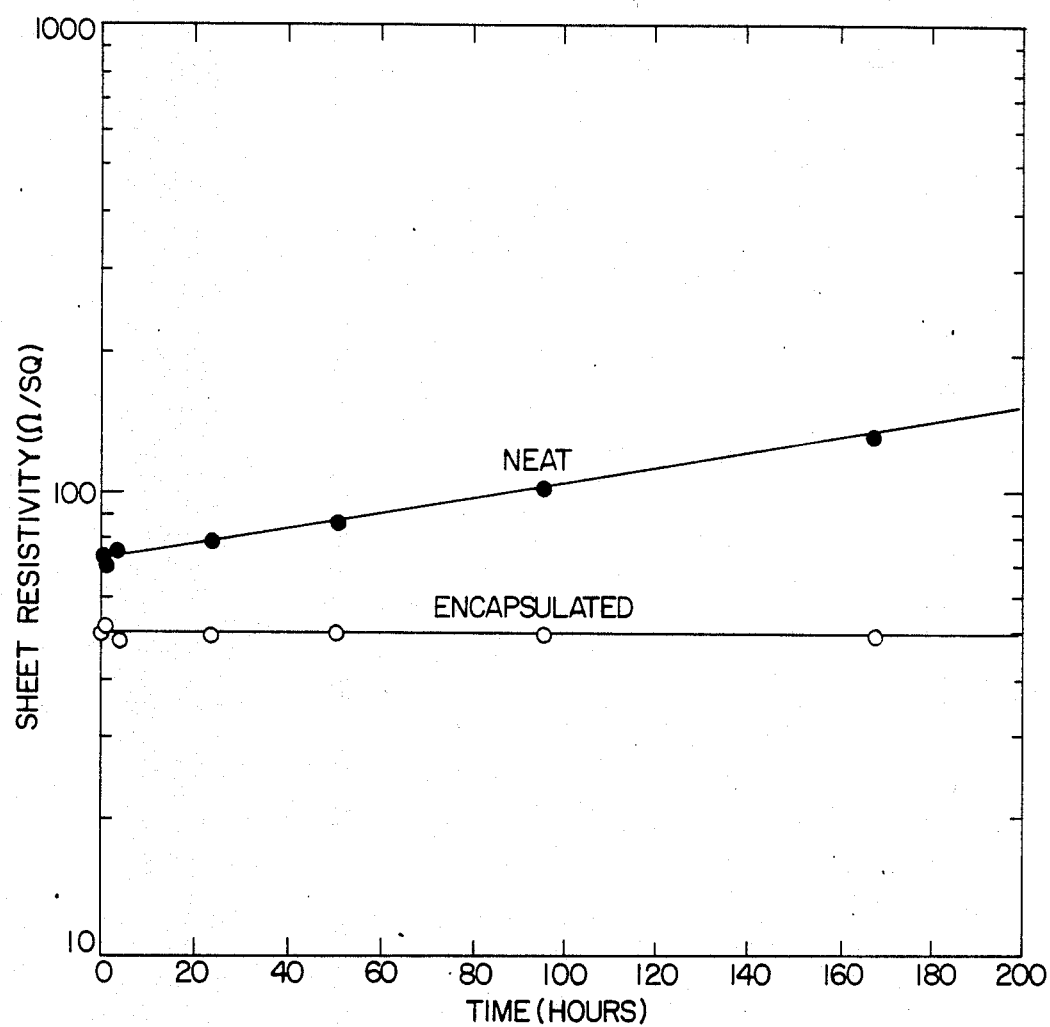
Figure 3:
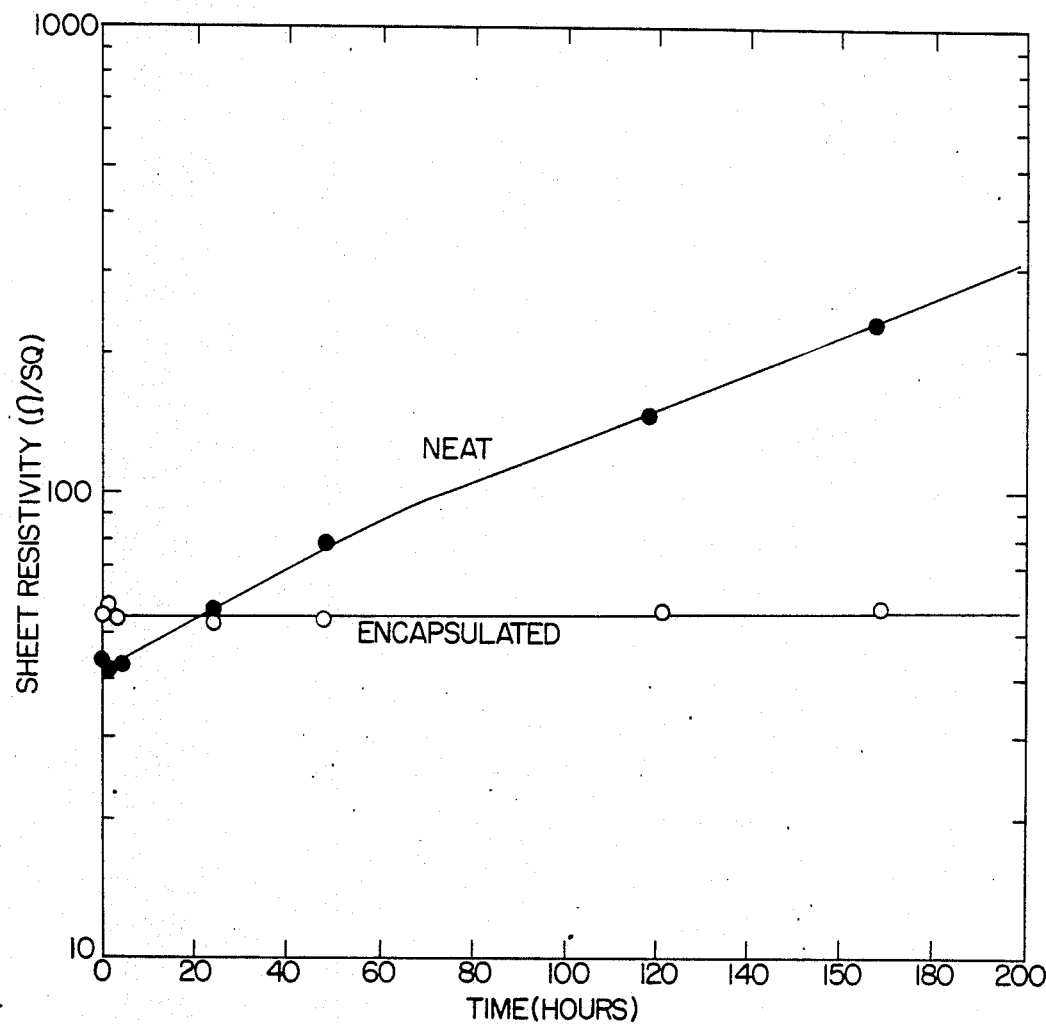

The stability of the non-encapsulated polypyrrole composite produced in Example III (a) above and the epoxy encapsulated polypyrrole composite produced in Example III (b) above were determined under each of the following environmental conditions:

(1) at 250° F. in air for 7 days
(2) in 100% oxygen at room temperature for 7 days
(3) at 160° F. and 90% relative humidity for 7 days The comparative results for each of the above environmental conditions (1), (2) and (3) are shown in the plots of FIGS. 1, 2 and 3, respectively, of the drawings, showing the variation in electrical conductivity as measured by sheet resistivity in ohms per square against time in hours.

In each of the plots of FIGS. 1, 2 and 3 it is noted that the electrical conductivity of the epoxy encapsulated conductive polypyrrole composites produced in III (b) above remained substantially stable in each of the hostile environmental conditions (1), (2) and (3) above over an approximately 7 day period, whereas the electrical conductivity of the non-encapsulated neat polypyrrole composite of III(a) above decreased, as measured by an increase in sheet resistivity, over the same period of time.

The shelf life of the neat non-encapsulated polypyrrole composite produced in III (a) above as compared to the encapsulated polypyrrole composite produced in III (b) above was determined at room temperature conditions over a period of 6 months. The variations in electrical conductivity over this period as measured by sheet resistivity for each of the above two systems are shown in the table below.

TABLE I

| Total time (months) | Resistivity ohms/square | |
|---|---|---|
| | Neat Polypyrrole Room temp. | Encapsulated Polypyrrole Room temp. |
| 0 | 36.7 | 64.6 |
| 1 | 63.0 | 67.0 |
| 2 | 69.2 | 65.1 |
| 3 | 73.1 | 67.7 |
| 4 | 78.6 | 64.3 |
| 5 | 81.3 | 65.7 |
| 6 | 85.3 | 64.8 |

It is seen from the table above that the epoxy encapsulated conductive polypyrrole composite had a long-term shelf life atability, whereas the non-encapsulated polypyrrole composite was relatively unstable in terms of electrical conductivity over the same period of time.

EXAMPLE V

Lamination of Impregnated Substrates Using Bis-maleimide Resin

This example is also for a 6"×6" four ply laminate, each of the plies produced as in Example III (a) following one cycle of polypyrrole impregnation. The impregnated fabrics were painted separately at ambient temperature with 40 grams of bis-maleimide resin mixture (U.S. Polymeric 388D) dissolved in 100 ml of methylene chloride. The four plies were precured under vacuum at 125° F. for 1 hour. They were then stacked together and cured in a high-pressure press. The pressure was approximately 100 psi. The cure temperature was 350° F. for 2 hours followed by 385° F. for 6 hours. The heat-up rate was 5°/minute. The resulting laminate exhibited good electrical and mechanical properties.

From the foregoing, it is seen that the invention provides a process for producing electrically conductive polymer materials, particularly polypyrrole films and composites, which are stabilized to preserve their conductivity over extended periods in hostile environments, by encapsulating such conductive materials with suitable, particularly epoxy, resins.

Since various changes and modifications will occur to and can be made readily by those skilled in the art without departing from the invention concept, the invention is not to be taken as limited except by the scope of the appended claims.

What is claimed is:

1. A process for stabilizing an electrically conductive polymer which comprises encapsulating a conductive polymer selected from the group consisting of polypyrrole and polyaniline with a resin selected from the group consisting of epoxy, polyixide and bis-maleimide resins.

2. The process of claim 1, said conductive polymer being in the form of a powder, a free-standing. film, or a composite comprised of a substrate impregnated with said conductive polymer.

3. The process of claim 2, said conductive polymer prepared by electrochemical or chemical means.

4. The process of claim 2, said encapsulating comprising applying a curable resin selected from the group consisting of epoxy, polyimide and bis-maleimide resins, to the conductive polymer, and curing said resin.

5. The process of claim 4, said resin being an epoxy resin, said curing taking place at elevated temperature.

6. A process for stabilizing an electrically conductive polymer in hostile environments which comprises impregnating a porous substrate with a conductive polymer selected from the group consisting of polypyrrole and polyaniline, to form a conductive composite, followed by the steps of applying a curable resin selected from the group consisting of epoxy, polyimide and bismaleimide resins, to said composite, and curing the resulting system to encapsulate said composite.

7. The process of claim 6, said substrate being a dielectric porous substrate selected from the group consisting of a porous ceramic, a porous glass, a porous organic foam and a woven or non-woven fabric.

8. The process of claim 7, said porous substance being a fabric selected from the group consisting of fiberglass fabric, mixed oxide fabric and a synthetic organic fabric.

9. The process of claim 8, said porous substance being fiberglass fabric.

10. The process of claim 8, said applying step comprising pre-pregging the fabric of said conductive composite with said curable resin, and said curing step being carried out at elevated temperature.

11. The process of claim 9, said conductive polymer being polypyrrole and said curable resin being an epoxy resin.

12. The process of claim 8, said conductive polymer being polypyrrole, said impregnating being carried out by contacting said fabric with an anode in an electrolytic cell containing an electrolyte comprising a pyrrole monomer and a substantially non-nucleophilic anion, electrochemically depositing a conductive pyrrole polymer in the pores of said fabric, and removing the resulting composite comprised of said fabric impregnated with said pyrrole polymer from said anode.

13. The process of claim 12, said fabric being fiberglass fabric and said curable resin being an epoxy resin, said applying step comprising pre-pregging the fiberglass fabric of said composite with said epoxy resin and said curing step being carried out at elevated temperature.

14. The process of claim 8, said conductive polymer being polypyrrole, said impregnating being carried out by contacting said fabric with a liquid pyrrole, contacting said fabric containing said liquid pyrrole with a solution of a strong oxidant capable of oxidizing pyrrole to a pyrrole polymer, and oxidizing said pyrrole polymer in the presence of a substantially non-nucleophilic anion, and precipitating a conductive pyrrole polymer in the pores of said fabric.

15. The process of claim 14, said fabric being fiberglass fabric and said curable resin being an epoxy resin, said applying step comprising pre-pregging the fiberglass fabric of said composite with said epoxy resin and said curing step being carried out at elevated temperature.

16. A stabilized electrically conductive polymer which comprises a conductive polymeric material selected from the group consisting of polypyrrole and polyaniline, encapsulated with a resin selected from the group consisting of epoxy, polyimide and bis-maleimide resins.

17. The stabilized conductive polymer of claim 16, said polymeric material being polypyrrole and said resin being an epoxy resin.

18. The stabilized conductive polymer of claim 16, said polymeric material being a composite comprised of a substrate impregnated with said polymeric material.

19. The stabilized conductive polymer of claim 18, said substrate being a fabric.

20. The stabilized conductive polymer of claim 19, said fabric being fiberglass fabric and said resin being an epoxy resin.

* * * * *